(12) United States Patent
Colombo et al.

(10) Patent No.: US 8,211,778 B2
(45) Date of Patent: Jul. 3, 2012

(54) FORMING ISOLATION REGIONS FOR INTEGRATED CIRCUITS

(75) Inventors: Roberto Colombo, Lentate S/Seveso (IT); Luca Di Piazza, Milan (IT)

(73) Assignee: Micron Technology, Inc., Boise, ID (US)

( * ) Notice: Subject to any disclaimer, the term of this patent is extended or adjusted under 35 U.S.C. 154(b) by 317 days.

(21) Appl. No.: 12/342,312

(22) Filed: Dec. 23, 2008

(65) Prior Publication Data

US 2010/0155881 A1    Jun. 24, 2010

(51) Int. Cl.
*H01L 21/76* (2006.01)

(52) U.S. Cl. ........ 438/426; 438/425; 438/362; 438/443; 257/623; 257/E21.082; 257/E21.55; 257/E21.552; 257/E21.553

(58) Field of Classification Search ............... 438/40, 438/42, 43, 425, 427, 439, 443, 444, 445, 438/700, 701, 426; 257/E21.552, E21.553, 257/E21.555
See application file for complete search history.

(56) References Cited

U.S. PATENT DOCUMENTS

| | | | | |
|---|---|---|---|---|
| 5,712,205 A | * | 1/1998 | Park et al. | 438/425 |
| 5,728,620 A | * | 3/1998 | Park | 438/425 |
| 5,858,842 A | * | 1/1999 | Park | 438/297 |
| 5,882,993 A | * | 3/1999 | Gardner et al. | 438/591 |
| 2006/0051932 A1 | * | 3/2006 | Yoneda | 438/424 |
| 2006/0220097 A1 | * | 10/2006 | Ogura | 257/315 |

* cited by examiner

*Primary Examiner* — Minh-Loan T Tran
*Assistant Examiner* — Leslie Pilar Cruz
(74) *Attorney, Agent, or Firm* — Trop, Pruner & Hu, P.C.

(57) ABSTRACT

A substrate may have active areas at different levels separated by a mask. Along the mask may be a shallow trench isolation. Along the shallow trench isolation may be a LOCOS isolation. The shape of a substrate transition region between the levels may be tunably controlled. The shallow trench isolation may reduce the bird's beak effect.

3 Claims, 3 Drawing Sheets

FORMING ISOLATION REGIONS FOR INTEGRATED CIRCUITS

BACKGROUND

This relates generally to the formation of active areas in microelectronic devices.

Active areas are areas where transistors may be formed. Generally, active areas are isolated from the remainder of an integrated circuit using local oxidation (LOCOS). Within the active area of a memory there is an array and a periphery. The array is a matrix of memory elements and the periphery is the portion of the active area outside the array.

The LOCOS process does not form, for example, substrate areas of different heights. In charge trapping and phase change memories, array and peripheral areas may be at different heights to allow the right process integration.

DETAILED DESCRIPTION

In accordance with some embodiments, a stepped or two-level substrate may be formed in microelectronic wafers, such as silicon wafers. The different heights may be used to form memory array and periphery circuits in some embodiments. Particularly, the array may be formed at the higher level and the periphery may be formed at the lower level.

In some embodiments, an isolation region may be formed by integrating a shallow trench isolation and local oxidation of silicon or LOCOS. This integration may lead to a tunable transition between substrate areas of different heights, expanding the application of LOCOS, in some embodiments, without incurring substantial limitations related to substrate area consumption. By defining a trench that acts as a barrier to LOCOS oxidation, the adverse effects, known as the bird's beak effect, may be managed in some embodiments.

Figure 1:
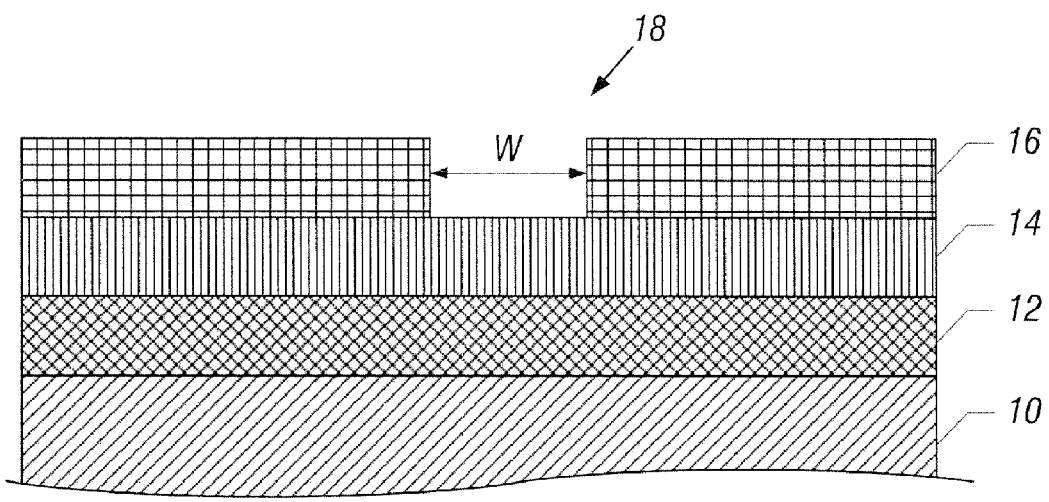
FIG. 1 is an enlarged, cross-sectional view at an early stage of manufacture.

Initially, as shown in FIG. 1, a silicon substrate may be coated with a pad ox 12, a hard mask 14, and a resist patterning layer 16. The resist patterning layer 16 may include an opening 18 formed by photolithographic techniques and having a diameter W. In one embodiment, the opening 18 may be a closed geometric shape, such as a square, an oval, or a circle. It defines, within its confines, an active area. In one embodiment, the pad ox 12 may be silicon dioxide that is grown or deposited. The hard mask 14 may be silicon nitride.

The dimension W of the aperture 18 may be large enough to avoid diffusion in ensuing local oxidation of silicon (LOCOS) oxidation.

Figure 2:
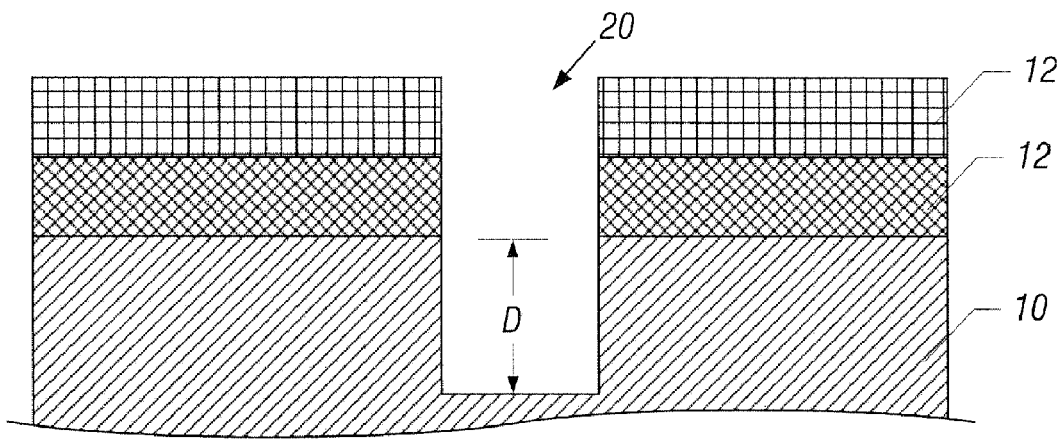
FIG. 2 is an enlarged, cross-sectional view at a subsequent stage.

Using the opening 18 in the resist patterning layer 16 as a mask, an aperture 20 may be formed, as shown in FIG. 2. The aperture 20 extends through the hard mask 18, the pad ox 12 and into the underlying substrate 10. Its extent in silicon is indicated by the arrow D that indicates the depth of a conventional LOCOS process.

Figure 3:
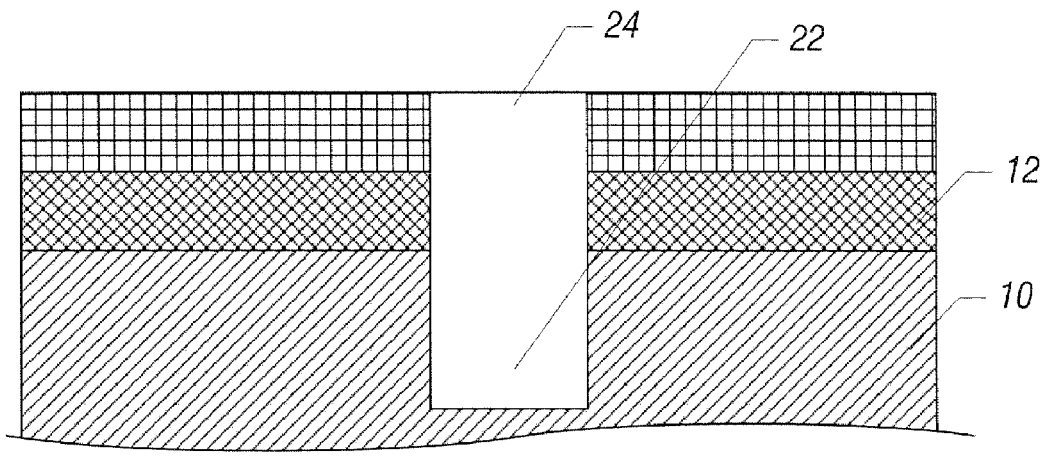
FIG. 3 is an enlarged, cross-sectional view at a subsequent stage.

Then, referring to FIG. 3, the aperture 20 may be filled with a fill material 24, such as silicon dioxide, and the wafer may be planarized, for example, by etch back or chemical mechanical planarization to remove the overlying portion of the fill material 24. The fill material 24 may be formed pursuant to a shallow trench isolation technology.

Figure 4:
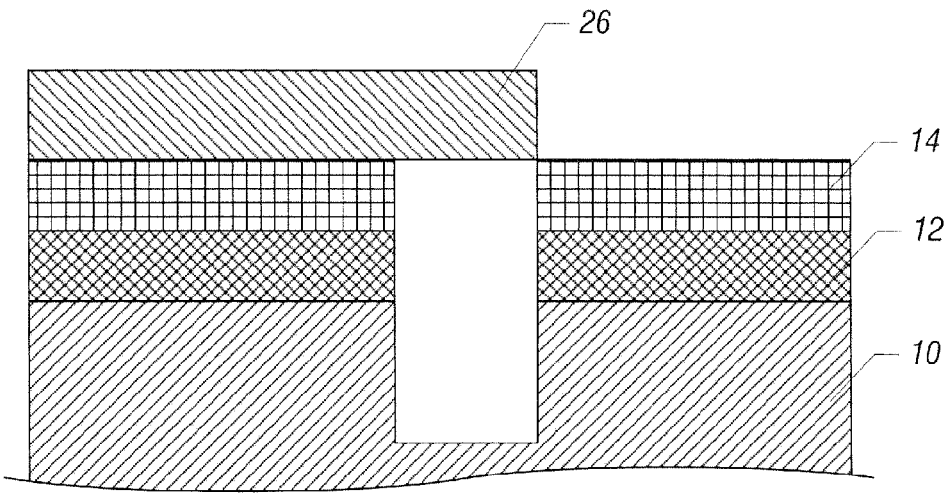
FIG. 4 is an enlarged, cross-sectional view at a subsequent stage.

Then, as shown in FIG. 4, the wafer is patterned in order to mask areas that will be higher. The mask 26, in this embodiment, covers the left side of FIG. 4 and the filled aperture 22. Thus, the right side will actually be the active area and is now ready for subsequent etching.

Figure 5:
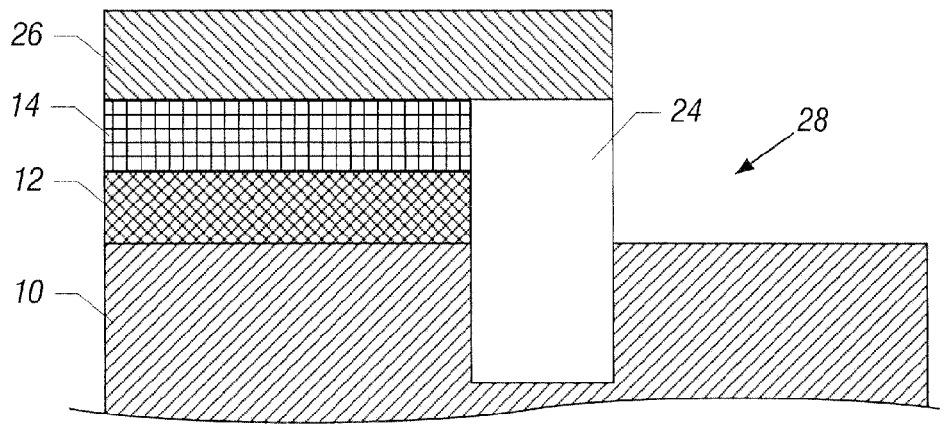
FIG. 5 is an enlarged, cross-sectional view at a subsequent stage.

Referring to FIG. 5, the initial etching extends through the hard mask 14 and pad ox 12, on the right side, as indicated at 28, down to the surface of the microelectronic substrate 10. Dry or wet etching may be used, or a combination of both, to remove these layers. After resist etching, the wafer is ready for a LOCOS oxidation process.

Figure 6:
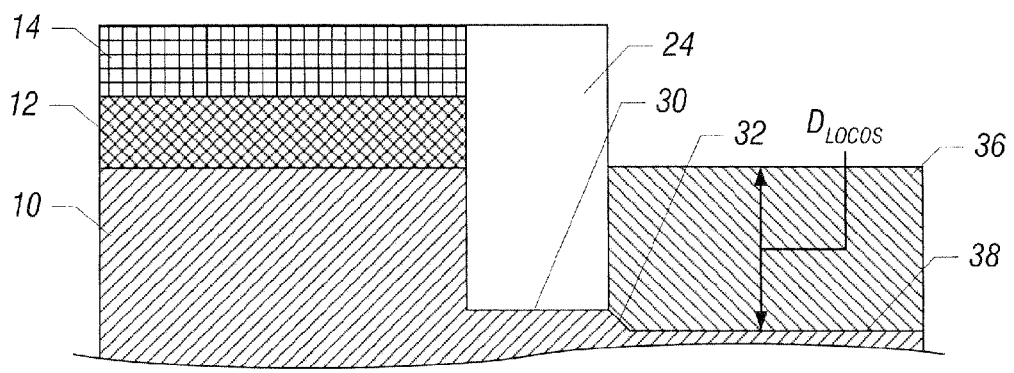
FIG. 6 is an enlarged, cross-sectional view at a subsequent stage.

Referring to FIG. 6, the LOCOS oxidation 36 has been formed to the depth D, consuming the portion of the silicon substrate 10 to the right of the fill material 24 and extending to a slightly greater depth indicated as $D_{LOCOS}$. The transition 32 in the bottom of the microelectronic substrate is tunable. In this case, an inclined ramp shape is depicted between the horizontal surfaces 38 and 30. The LOCOS oxide 36 fills the area above the transition 32 and surface 38. The transition 32 may avoid sharp ends at the trench bottom. Particularly where the oxidation depth $D_{LOCOS}$ is slightly greater than the trench depth D, shown in FIG. 2, sharp corners may be desirably avoided in some embodiments.

The fill material 24, located alongside the pad ox 12 and hard mask 14, may reduce the effect of the bird's beak. Normally, the bird's beak effect involves an increased oxide growth in the region under the edge of the hard mask. Because of the imposition of the fill material 24, the diffusion of oxidants, such as $O_2$ and $H_2O$, is reduced into the region under the hard mask 14 and pad oxide 12. Oxidant diffusion to the substrate 10 is reduced or blocked by the effective wall defined by the material 24. As a result, a gentle curved insulation transition region 32 may be formed, ideally, right at the bottom outside corner of the fill material 24. In some embodiments, the region 32 may hit further up on fill material 24, but it is most advantageous for it to hit right at the corner, as depicted in FIG. 6.

The production of the arrangement, shown in FIG. 6, where the LOCOS oxide 36 forms down to a point right at the corner of the fill material 24 may reduce dislocation formation in some embodiments. The transition region 32 is defined by the width of the fill material 24 because oxidation of substrate 10 under the pad oxide 12 and hard mask 14 is prevented or reduced by the blocking oxide wall defined by the fill material 24. Thus, to move the region 32 downwardly, the width of the fill material 24 may be reduced and to move the region 32 upwardly, the width of the fill material 24 may be increased to achieve the arrangement where the region 32 hits right at the outer, lower corner of the fill material 24, as depicted in FIG. 6.

Figure 7:
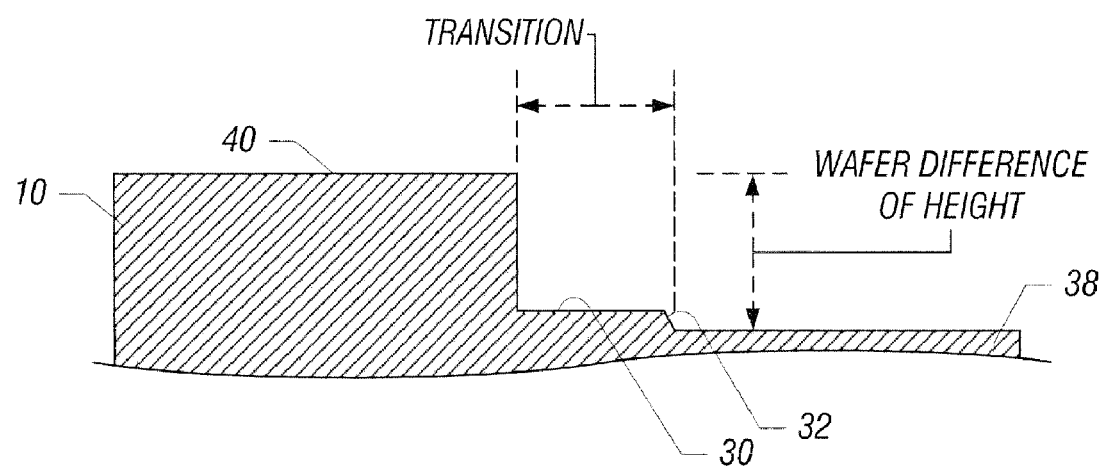
FIG. 7 is an enlarged, cross-sectional depiction after the formation of a two-level substrate.

The hard mask 14, the pad ox 12, and the LOCOS oxide 36 may be removed to create the substrate 10 shown in FIG. 7 with an upper surface 30, a transition 32, and a lower surface 38. The transition 32 and surface 30 between the upper level 40 and the lower surface 38 becomes a transition region such that some components may be formed on the level 40 of the FIG. 7 and others may be formed on the surface 38. These components will be isolated from one another because of the step or height difference.

The extent of the transition, in terms of its length, may be tunable by controlling the dimensions of the trench 20. The shape of its bottom may also be controllable based on the etching process that is utilized.

In some embodiments, a two level structure may be utilized for periphery and memory. The transition between the two level structures may be tunable by using a combination of a shallow trench isolation structure with a LOCOS structure. Tunability may be achieved, in some embodiments, by controlling the width of the shallow trench isolation structure. Because of the imposition of the shallow trench isolation between the nitride mask and pad ox and the area that will form the localized oxidation, the bird's beak effect may be controlled in some embodiments.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

forming a trench isolation in a substrate;

masking the substrate on one side of said trench isolation and exposing the substrate on the other side of said trench isolation all the way to said trench isolation;

oxidizing said exposed side of said substrate to form substrate regions on either side of said trench isolation that are at different vertical levels and are sufficiently planar to enable the formation of integrated circuit transistors; and wherein oxidizing said exposed side of said substrate includes oxidizing to a depth greater than the depth of said trench isolation.

2. The method of claim 1, wherein oxidizing said exposed side of said substrate includes providing said levels for the formation of periphery devices on one side and memory devices on the other side of said trench isolation.

3. The method of claim 1 wherein oxidizing said exposed side of said substrate includes oxidizing until the oxidation intersects the bottom of said trench isolation.

\* \* \* \* \*